United States Patent [19]

Dhong et al.

[11] Patent Number: 5,075,571

[45] Date of Patent: Dec. 24, 1991

[54] PMOS WORDLINE BOOST CRICUIT FOR DRAM

[75] Inventors: Sang H. Dhong, Mahopac; Wei Hwang, Armonk, both of N.Y.; Yoichi Taira, Tokyo, Japan

[73] Assignee: International Business Machines Corp., Armonk, N.Y.

[21] Appl. No.: 636,840

[22] Filed: Jan. 2, 1991

[51] Int. Cl.[5] .............. H03K 17/687; H01L 27/085; H01L 27/108
[52] U.S. Cl. ............................ 307/296.2; 307/443; 307/572; 307/303.2; 307/246
[58] Field of Search ............ 307/443, 242, 571, 572, 307/296.2, 303.2, 304

[56] References Cited

U.S. PATENT DOCUMENTS

| | | | |
|---|---|---|---|
| 4,514,829 | 4/1985 | Chao | 365/189 |
| 4,618,784 | 10/1986 | Chappell et al. | 307/449 |
| 4,639,622 | 1/1987 | Goodwin et al. | 307/482 |
| 4,647,956 | 3/1987 | Shrivastava et al. | 307/296.2 X |
| 4,678,941 | 7/1987 | Chao et al. | 307/449 |
| 4,701,642 | 10/1987 | Pricer | 307/451 X |
| 4,704,706 | 11/1987 | Nakano et al. | 365/203 |
| 4,843,261 | 6/1989 | Chappell et al. | 307/449 |
| 4,999,518 | 3/1991 | Dhong et al. | 307/443 X |
| 5,001,365 | 3/1991 | Murabayashi et al. | 307/443 X |

OTHER PUBLICATIONS

Rajeevakumar et al., "Simple Wordline Boosting Circuit for High Performance CMOS DRAMS", IBM Technical Disclosure Bulletin, vol. 28, No. 6, Nov. 1985, pp. 2660-2662.

Primary Examiner—Davis Mis
Attorney, Agent, or Firm—Perman & Green

[57] ABSTRACT

A wordline driver circuit is shown for a DRAM, the circuit comprising a PMOS transistor structure having one contact coupled to a wordline, a second contact coupled to a negative voltage supply and a gate coupled to a control input, the transistor having an N-well about the gate, first and second contacts. An isolating structure is positioned about the N-well to enable it to be a separately controlled from surrounding N-well structures. Pulse circuits are coupled to the transistor for applying, when activated, a potential that enables the wordline to transition to a more negative potential. A bias circuit is also provided for biasing the N-well at a first potential and a second lower potential, the second lower potential applied when the pulse circuits are activated. As a result, body effects in the PMOS transistor are minimized while at the same time enabling a boost potential to be applied to the wordline.

10 Claims, 3 Drawing Sheets

PMOS WORDLINE BOOST CRICUIT FOR DRAM

FIELD OF THE INVENTION

This invention relates to wordline drivers for semiconductor memories and, more particularly, to a wordline driver circuit which enables wide wordline voltage swings in a dynamic random access memory (DRAM).

BACKGROUND OF THE INVENTION

In high density DRAMS with PMOS array transistors, various circuit and device features create limitations in the magnitude of voltage swings achievable on the DRAM's wordlines. In FIG. 1, a prior art DRAM cell is shown with a wordline driver that employs both p and n channel transistors. Each DRAM cell includes a PMOS transistor 10 and capacitor 12 which, in combination, store a charge indicative of a stored bit. The cell is interrogated by application of appropriate potentials to wordline 14 and bitline 16. The output from a cell is differentially detected in a sense amplifier 18, in response to the application of an output on bitline 16 and its complement on bitline 20.

Wordline 14 is powered from a wordline driver 21 which comprises a PMOS transistor 22 whose source is connected to a supply Vdd, and an NMOS transistor 24 whose drain is connected to ground.

Assume that the memory cell has already been written into and that capacitor 12 contains a charge indicative of a bit value. Wordline 14 and bitline 16 are then simultaneously driven towards ground to enable PMOS transistor 10 to conduct and to reflect onto bitline 16, the charge state on capacitor 12. This is accomplished by applying a decoder input to terminal 26 which, in turn, causes NMOS transistor 24 to become conductive and PMOS transistor 22 non-conductive. A like voltage transition occurs on bitline 16, via the operation of sense amplifier 18.

Given the above conditions, if a charge exists on capacitor 12, PMOS transistor 10 is rendered conductive and an output is produced on bitline 16 which is detected by sense amplifier 18. However, when both wordline 14 and bitline 16 are at ground level, node 28 between PMOS transistor 10 and capacitor 12 only falls to the magnitude of the threshold potential Vt of PMOS transistor 10. Thus, the voltage at node 28 traverses between Vdd and |Vt| (rather than ground). The application of a more negative potential to the drain of NMOS transistor 24 will not solve the problem, since NMOS transistor 24 is constructed on a grounded P substrate. Such a negative potential applied to the drain will cause a forward bias to be applied to the substrate junction and render the transistor inoperative.

Since the objective is to pull wordline 14 to a more negative potential, while simultaneously using a grounded P substrate, the prior art has suggested the use of a PMOS transistor as the "pull-down" transistor. Such a prior art circuit is shown in FIG. 2, wherein PMOS transistor 30 has been substituted for NMOS transistor 24 shown in FIG. 1.

In FIG. 3, the semiconductor structure of PMOS transistor 30 is shown in cross section. An N-well 32 isolates the various contact regions, provides for a conduction channel, and isolates PMOS transistor 30 from substrate 34. N-well 32 is biased by the application of Vdd to contact 36. In this instance, in lieu of ground being applied to the drain of PMOS transistor 30, a more negative supply voltage (−V) is connected thereto.

When wordline 14 is to be pulled down, a voltage Vc is applied to control terminal 40 and its complement to terminal 42 (FIG. 2). If it is assumed that Vc is at ground level, the potential on wordline 14 falls to the higher voltage of Vc+|VT| or −V. If Vc+|Vt| falls below −V, the wordline is clamped to −V by the potential on the drain of PMOS transistor 30. Since N-well 32 is biased at Vdd, the application of Vc (e.g. ground) to terminal 40 applies a potential across N-well 32 and, as a result, causes an increase in the body effect of transistor 30 and a concomitant increase in its threshold voltage Vt. Thus, an even more negative Vc is now needed to enable formation of a conduction channel beneath the gate of transistor 30. Therefore, while the application of −V to the drain of transistor 30 aids in the pull-down of wordline 14, the negative control potential Vc creates a counter-vailing affect within transistor 30 which must be accommodated by a further adjustment of Vc. As the N-well, which isolates transistor 30 from substrate 34, also encompasses a plurality of other PMOS transistors, it is undesirable to place such a high reverse bias across the N-well.

Other prior art showing various wordline decoding and level setting techniques can be found in the following prior art.

In U.S. Pat. No. 4,514,829, a CMOS decoder and driver circuit for a DRAM memory are shown wherein the pitch of the decoder is twice that of the wordlines and the number of decoders is thereby reduced by one half.

In U.S. Pat. No. 4,618,784 to Chappell et al., a decoder circuit employing an n-channel pull-down transistor is shown.

In U.S. Pat. No. 4,639,622 to Goodwin et al., a wordline boost circuit is described wherein an additional pair of MOS transistors are connected to a clock signal and produce a voltage boosting signal. A capacitor connects the boost circuit to an output lead and applies a boost signal to enhance voltage level changes on the output lead. In U.S. Pat. No. 4,678,941 to Chao et al., a decoder circuit having a boost word-line clock is described. The system described by Chao et al. employs a negative substrate bias which thus avoids junction forward-biasing which can result from voltage undershoots below ground.

In U.S. Pat. No. 4,704,706 to Nakano et al., a wordline booster circuit employs a precharged capacitor in a boot strap circuit configuration. The Nakano et al. circuit employs only NMOS transistors and thus, does not have the same threshold potential problems exhibited in a PMOS arrangement.

In U.S. Pat. No. 4,843,261 to Chappell et al., still another CMOS decoder/driver circuit is described using an n channel transistor for pull down purposes.

In IBM Technical Disclosure Bulletin, Vol. 28, No. 6, November 1985, pp. 2660–2662, another wordline boost circuit is shown wherein charged capacitances are employed to pull a wordline to a more negative potential than ground. Complementary MOS transistors are used in the aforementioned circuit.

It is an object of this invention to provide an improved PMOS wordline boost circuit for a DRAM.

It is another object of this invention to provide a PMOS wordline boost circuit which avoids increased body effects within the PMOS driver transistors.

It is still another object of this invention to provide a PMOS wordline boost circuit which provides an improved wordline voltage transition, without the need for additional, exterior-generated logic potentials.

SUMMARY OF THE INVENTION

A wordline driver circuit is shown for a DRAM, the circuit comprising a PMOS transistor structure having one contact coupled to a wordline, a second contact coupled to a negative voltage supply and a gate coupled to a control input, the transistor having an N-well about the gate, first and second contacts. An isolating structure is positioned about the N-well to enable it to be a separately controlled from surrounding N-well structures. Pulse circuits are coupled to the transistor for applying, when activated, a potential that enables the wordline to transition to a more negative potential. A circuit is also provided for biasing the N-well at a first potential and a second lower potential, the second lower potential applied when the pulse circuits are activated. As a result, body effects in the PMOS transistor are minimized, while at the same time enabling a boost potential to be applied to the wordline.

DETAILED DESCRIPTION OF THE INVENTION

Figure 4:
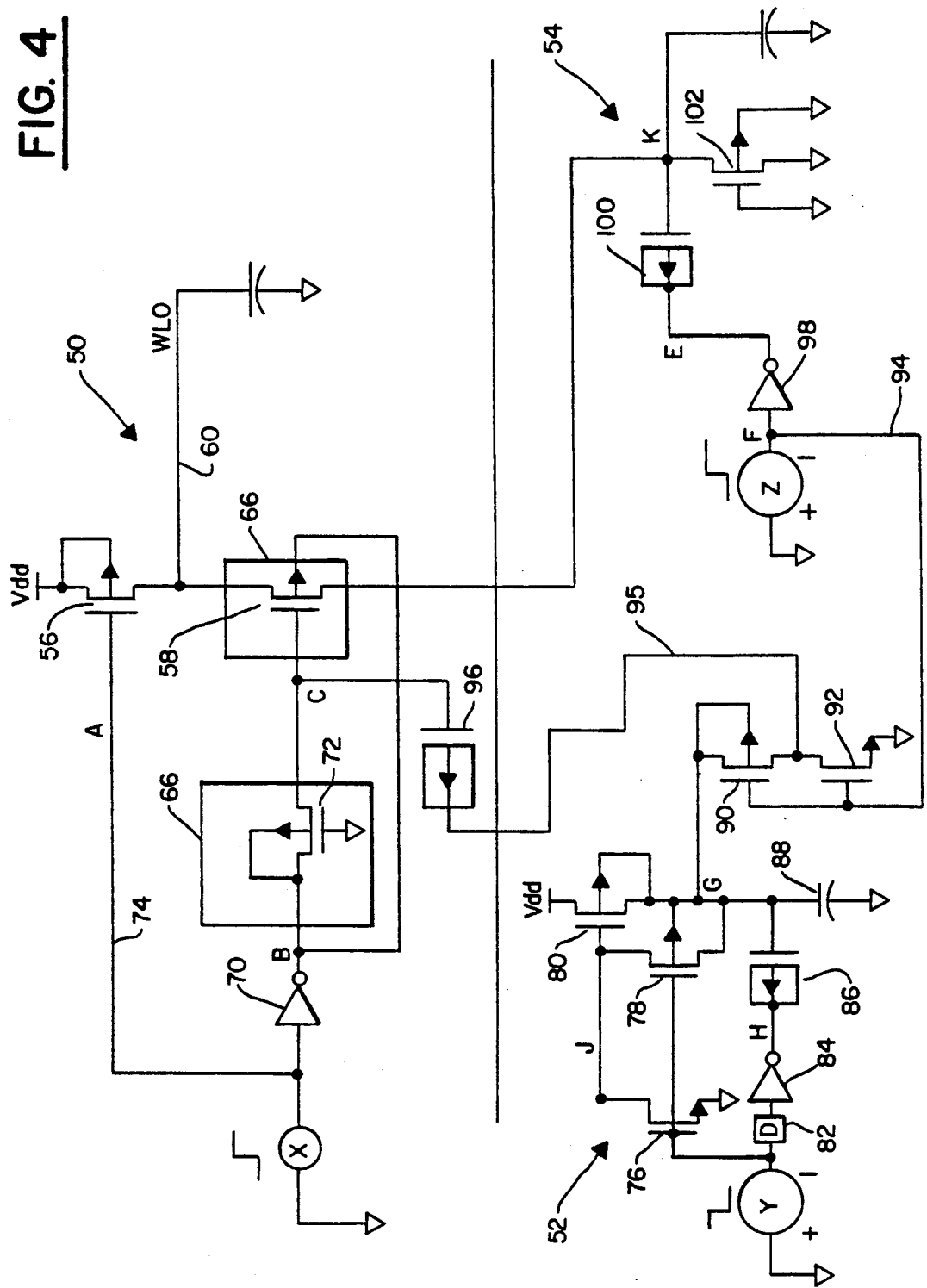
FIG. 4 is a circuit diagram of a wordline driver circuit which embodies the invention hereof.

In FIG. 4, a circuit diagram embodying the invention is shown and includes a wordline driver circuit 50 (1 per wordline), a pulse generator circuit 52 and a negative supply circuit 54. Pulse generator 52 and negative supply circuit 54 are shared by all wordline drivers.

Figure 1:
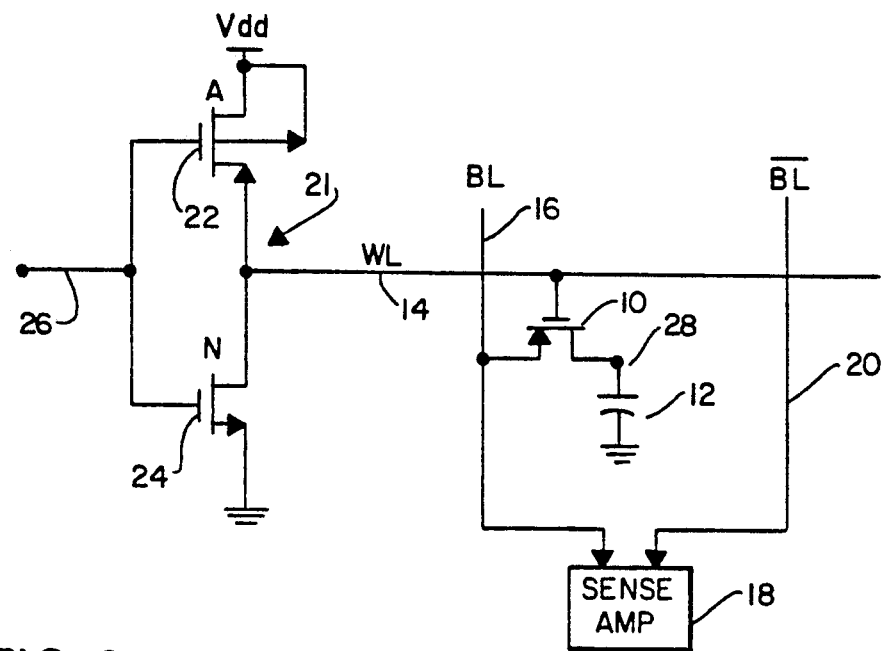
FIG. 1 is a schematic circuit diagram of a prior art DRAM circuit, with a CMOS wordline driver circuit.
Figure 2:
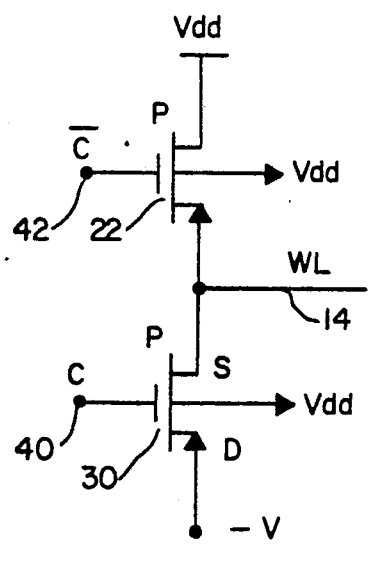
FIG. 2 is a prior art wordline driver circuit using PMOS-only type transistors.
Figure 3:
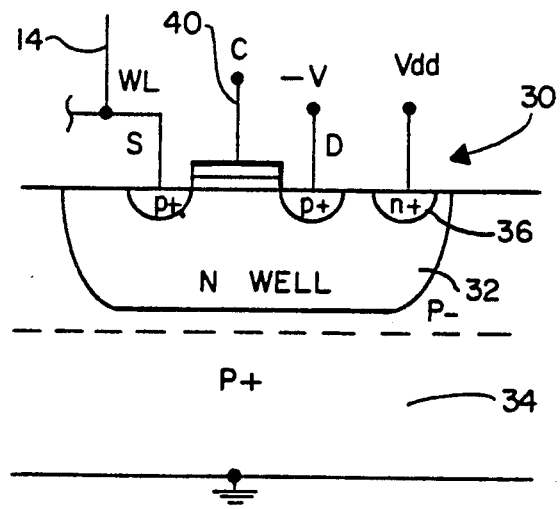
FIG. 3 is a sectional view of one of the PMOS transistors in FIG. 2, showing an N-well surrounding the various transistor structures.

Wordline driver 50 comprises PMOS transistors 56 and 58 which are coupled to a wordline 60. The body effect problem discussed with respect to FIG. 2 is avoided by isolating the N-well of pull down PMOS transistor 58 from surrounding N-well structures by an isolation trench 66. This isolation enables the bias of the N-well associated with transistor 58 to be decreased during pull-down from its normal level of Vdd. Due to area limitations for each wordline driver, N-well isolation by trench construction is more real estate efficient than the provision of separate N-wells for individual transistors.

Figure 5:
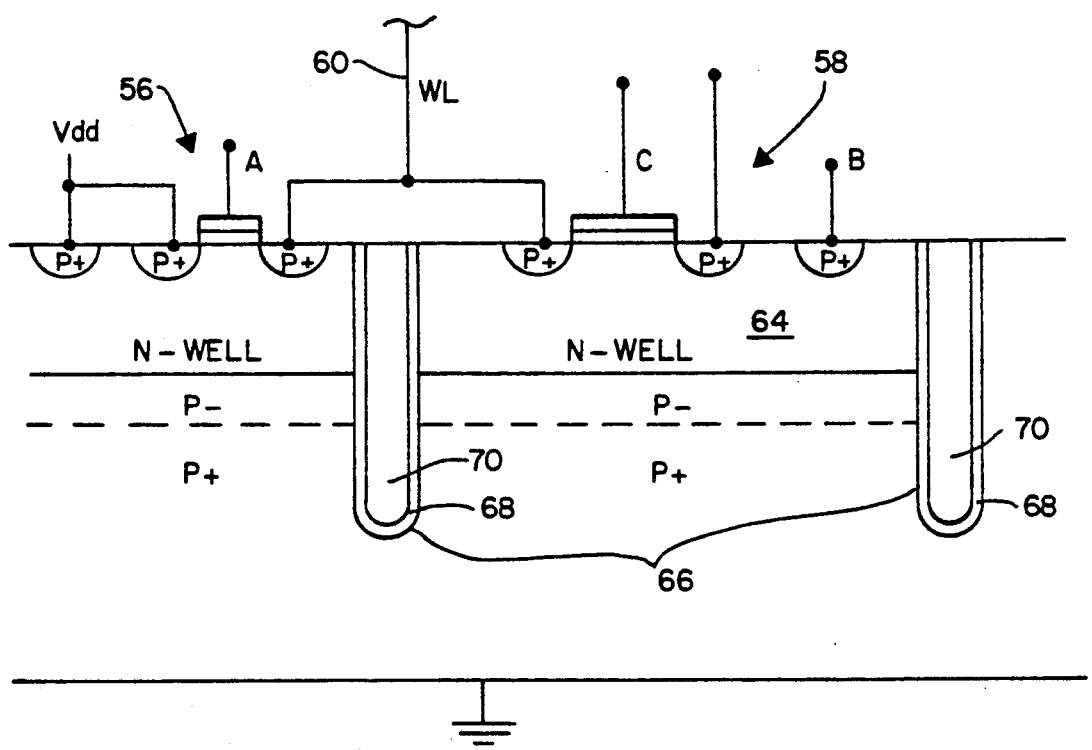
FIG. 5 is a sectional view of a semiconductor structure which illustrates a portion of a structure of the wordline driver circuit.

As shown in FIG. 5, N-well 64 underlies the contacts of PMOS transistor 58 and is isolated from adjoining N-well regions by trench isolation regions 66. Trench regions 66 are produced in the same manner, and preferably at the same time, as trench capacitors are produced for the individual memory cells within the DRAM.

Each trench isolation region 66 includes a dielectric layer 68 adjoining a P+ contact region 70. In this instance, no contact is made to P+ region 70, to enable trenches 66 to act as isolating barriers between the various N-well regions. In FIG. 4, trench isolation regions 66 are schematically shown by dotted lines 66 which surround and isolate their respective N-well regions.

The circuits shown in FIG. 4 respond to three decoder inputs, X, Y, and Z. Input X is applied, via an inverter 70, to a PMOS transistor 72, whose gate is connected to ground and whose underlying N-well is isolated by trench isolation 66. The output from transistor 72 is applied to the gate of PMOS pull-down transistor 58 whose respective N-well is also isolated by trench isolation 66. Input X is also applied to the gate of PMOS transistor 56, directly via conductor 74. It is to be noted that various nodes of the circuit are represented alphabetically, which nodes will be referred to during the description of the operation of the circuit.

Pulse generator circuit 52 receives an input Y from a decoder circuit, which input is applied to NMOS transistor 76 and PMOS transistor 78, in parallel. The drain and source contacts of transistors 76 and 78, respectively, are connected to the gate of PMOS transistor 80. Input Y is also applied via a delay 82, through an inverter 84 to a PMOS transistor 86 connected in a capacitor configuration. The drains of transistors 78 and 80, as well as the gate of transistor 86 are connected, in common at node G, to both a capacitor 88 and to the source of PMOS transistor 90.

PMOS transistor 90 and NMOS transistor 92 have their conduction states controlled by a further decoder input Z, as it is applied to their respective gates, via conductor 94. The common connection between transistors 90 and 92 provides an output to a capacitor-configured PMOS transistor 96 whose gate is, in turn, connected to node C in wordline driver circuit 50.

Negative supply circuit 54 is also controlled by input Z which is applied through inverter 98 to capacitor-configured PMOS transistor 100. Capacitor 100 has one terminal connected to node K, as does PMOS transistor 102, which is connected in a diode configuration.

The operation of the circuit shown in FIG. 4 will now be described) during both standby and activation/boost phases. During standby, input X is at a low level, which level is inverted by inverter 70 and causes node B to be at the high (Vdd) level. As a result, the isolated N-wells associated with PMOS transistors 58 and 72 are biased to the Vdd state. PMOS transistor 72 is conductive and node C is biased to the Vdd level. PMOS transistor 58 is non-conducting. During this time, transistor 56 is conductive and wordline 60 is maintained at the high state.

During standby, input Y is at the high state, causing NMOS transistor 76 to be conductive and to clamp node J to ground. Transistor 78 is biased to non-conduction. The ground state at node J forces transistor 80 into conduction and causes capacitor 88 to be charged to Vdd. The high state from input Y is also applied, via delay 82, through inverter 84 to negatively charge capacitor 86.

During standby, input Z is at the low level (node F). The resulting low level at node F is passed to the gate of transistor 90 via conductor 94, causes it to be conductive and to thereby enable capacitor 96 to be charged to approximately Vdd, via conductor 95. NMOS transistor 92 is non-conductive at this time.

In order to activate wordline 60, input Y initially falls to the low state which causes node H to swing to the high state (Vdd). The resulting positive-going voltage swing is coupled through capacitor 86 to capacitor 88, which it will be recalled, already is charged to the level of Vdd. As a result, the charge on capacitor 88 increases to almost twice Vdd. Approximately 20 nanoseconds later (after capacitor 88 has been charged), input X traverses to the high state, thereby causing node A to go high and to turn off PMOS transistor 56. Node B falls to the low state and drops the bias levels on the N-wells associated with transistors 58 and 72 to ground level. As a result of isolating trenches 66, the reduced bias levels do not affect adjoining transistor N-wells.

The fall in level at node B from Vdd to ground enables transistor 72 to conduct and to pull node C down from Vdd to a potential above ground, determined by the threshold voltage of transistor 72. This fall enables transistor 58 to conduct. As a result, wordline 60 is able to discharge to a voltage determined by a potential at node C, plus the threshold voltage between node C and the drain of transistor 58.

It will be recalled that input Z was at the low state while capacitor 88 was being charged to almost twice Vdd, triggered by the transition of input Y from high to low. As a result, transistor 90 was conductive and caused the charge to be transferred to capacitor 96. It will be recalled that the gate and source of PMOS transistor 72 are at ground potential. PMOS transistor 72 thus acts as a diode and isolates node B from voltage transitions at node C. Thus, so long as node C is at a lower potential than |Vt| of PMOS transistor 72, it can act independently thereof. When input Z traverses to the high state, PMOS transistor 90 is rendered non-conductive and NMOS transistor 92 conductive. As a result, capacitor 96 discharges rapidly through transistor 92 and pulls node C to a negative voltage with respect to ground. The resulting negative shift at node C causes transistor 58 to conduct more heavily.

As will further be recalled, when input Z was at the low state, that state was inverted by inverter 98 and caused capacitor 100 be charged to approximately Vdd. Thus, when input Z traverses to the high state, node E falls, discharges capacitor 100 and causes node K to fall to a more negative value. Thus, the combined negative transitions at nodes C and K cause wordline 60 to be pulled to a negative potential. At the same time, because the N-well of transistor 58 is biased to the low state, the increase in magnitude of Vt of PMOS transistor 66 due to the body effect is minimized.

The connection of the N-well associated with transistor 72 to node B enables improved operation thereof. This is because when control input X traverses from the low to the high state, node B falls to the low state and biases the N-well of transistor 72 at the low state. As a result, the detrimental body effects which might occur in transistor 72, were its N-well connected to Vdd, are avoided when node C falls to a heavily negative potential through the action of the discharge of capacitor 96.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A wordline driver circuit for a DRAM, the combination comprising:
   a PMOS transistor structure having one contact coupled to a wordline, a second contact coupled to a negative supply and a gate coupled to a control input, said transistor having an N-well positioned about said gate and first and second contacts;
   isolating means positioned about said N-well;
   pulse means coupled to said PMOS transistor for applying, when activated, negative potentials to cause conduction through said transistor and enable said wordline to transition to a more negative potential; and
   means for biasing said N-well at a first potential and at a second, lower potential, said lower potential applied when said pulse means is activated.

2. The wordline driver circuit as recited in claim 1 wherein said N-well is surrounded by other N-well structures and said isolating means prevents a bias of said N-well from affecting said other N-well structures.

3. The wordline driver circuit as recited in claim 2 wherein said pulse means comprises first and second circuit means coupled, respectively, to said gate and said second contact of said PMOS transistor structure, said first and second circuit means operating substantially simultaneously to apply said negative potential to said gate and said second contact means.

4. The wordline driver circuit as recited in claim 3 wherein the first circuit means includes a capacitor which is initially charged to a first level and, upon said first circuit means receiving an input signal, is charged to approximately twice said first level, said first circuit means, in response to another input signal, causing said capacitor to discharge, said discharge resulting in the application of a negative going potential to the gate of said PMOS transistor structure.

5. The wordline driver circuit as recited in claim 4 wherein said second circuit means includes a capacitor which is initially charged to a first level and, in response to said another input signal, is discharged to cause said second contact to traverse to a more negative potential than said negative voltage supply.

6. The wordline driver circuit as recited in claim 5 wherein said means for biasing causes the N-well of said PMOS transistor structure to traverse to the level of said negative supply, and said first and second circuit means cause the negative going potentials from the discharge of their respective capacitors, to be applied respectively to said gate and second contact of said PMOS transistor structure.

7. A wordline driver circuit for a high density DRAM, said circuit having at least first, second and third control signals, each said signal exhibiting standby and active states, the combination comprising:
   first and second PMOS transistors connected, drain to source, between high and low level supplies;
   a wordline connected between said first and second PMOS transistors;
   an N-well encompassing said second PMOS transistor;
   isolation means for electrically isolating said N-well from other N-wells in said substrate;
   circuit means responsive to the standby state of said first control signal, to render said first and second PMOS transistors conductive and non-conductive respectively, and further responsive to said active state of said first control signal to reverse the conductivity states of said first and second PMOS transistors;
   pulse circuit means including first capacitive means connected to the gate of said second PMOS transistor and responsive to the standby status of said second and third control signals to enable the charging of said first capacitive means, and to the active status of said second control signal to further charge said first capacitive means; and a low level supply circuit connected to said pulse circuit means and provided with second capacitive means connected to a terminal of said second PMOS transistor, and responsive to the standby state of said third control input to cause said second capacitive means to be charged, and further responsive to the active state of said third control signal to cause the simultaneous discharge of said first and second capacitance means, whereby said second PMOS device is driven to conduction by negative-potentials created by discharges of said capacitance means, to thereby drive said wordline to a negative potential.

8. The wordline driver circuit as recited in claim 7, wherein said circuit means includes means further responsive to said active state of said control signal to apply a low level bias to said N-well to reduce the voltage difference thereacross when said capacitive means are discharged, to thereby reduce the body effect in said second PMOS transistor.

9. The wordline driver as recited in claim 8 wherein said isolation means comprises a dielectric trench surrounding said second PMOS transistor and its N-well and isolating said N-well from other N-well structures in said VLSI substrate.

10. The wordline driver circuit as recited in claim 9 wherein said circuit means further include a diode which isolates said further responsive means from said first capacitance means, whereby the charge on said first capacitance means does not affect the bias applied to said N-well.

* * * * *